(12) United States Patent
Bhatt et al.

(10) Patent No.: US 6,699,350 B2
(45) Date of Patent: Mar. 2, 2004

(54) DIELECTRIC STRUCTURE AND METHOD OF FORMATION

(75) Inventors: Anilkumar C. Bhatt, Johnson City, NY (US); Stephen J. Fuerniss, deceased, late of Endicott, NY (US), by Joan Cangelosi, legal representative; Roy H. Magnuson, Endicott, NY (US); Voya R. Markovich, Endwell, NY (US)

(73) Assignee: International Business Machines Corporation, Armonk, NY (US)

(*) Notice: Subject to any disclaimer, the term of this patent is extended or adjusted under 35 U.S.C. 154(b) by 32 days.

(21) Appl. No.: 10/217,616

(22) Filed: Aug. 12, 2002

(65) Prior Publication Data

US 2003/0010440 A1 Jan. 16, 2003

Related U.S. Application Data

(62) Division of application No. 09/458,291, filed on Dec. 10, 1999, now Pat. No. 6,495,239.

(51) Int. Cl.$^7$ ............................. B32B 31/00; B05D 5/12
(52) U.S. Cl. ............................. 156/275.5; 156/307.1; 156/307.7; 156/272.2; 427/96; 427/97; 427/487; 427/402; 430/312; 430/257
(58) Field of Search ............................. 156/275.5, 307.1, 156/307.7, 272.2; 427/96, 97, 487, 402; 430/312, 257

(56) References Cited

U.S. PATENT DOCUMENTS

| | | |
|---|---|---|
| 3,950,170 A | 4/1976 | Grosholz |
| 4,496,646 A | 1/1985 | Ito |
| 4,581,316 A | 4/1986 | Yamanouchi |
| 4,684,436 A | 8/1987 | Burns et al. |
| 5,055,943 A | 10/1991 | Kishida |
| 5,543,262 A | 8/1996 | Sypek et al. |
| 5,672,225 A | 9/1997 | Cowan |

OTHER PUBLICATIONS

McGrath, Peter "Multilayer PCB Manufacture", Printed Circuit Fabrication 1978–1998, vol. 21, No. 2, pp. 20–24, Feb. 1998.

Multi Layer Substrate With Low Coefficent Of Thermal Expansion, Nakamura et al., 2000 International Symposium on Microelectric, pp. 235–240.

Primary Examiner—Elizabeth M. Cole
Assistant Examiner—Hai Vo
(74) Attorney, Agent, or Firm—Schmeiser, Olsen & Watts; Arthur J. Samodovitz

(57) ABSTRACT

A method for forming a dielectric structure. A first layer is formed, wherein the first layer includes a first fully cured photoimageable dielectric (PID) material. A sticker lays is nonadhesively formed on the first layer, wherein the sticker layer includes a partially cured PID material. A second layer is nonadhesively formed on the sticker layer, wherein the second layer includes a second fully cured PID material, wherein the sticker layer is nonadhesively sandwiched between the first layer and the second layer such that the sticker layer is in non-adhesive contact with the first layer and in non-adhesive contact with the second layer, and wherein the sticker layer is capable of remaining in non-adhesive contact with the first layer and the second layer until the sticker layer is subsequently subjected to additional curing.

22 Claims, 7 Drawing Sheets

DIELECTRIC STRUCTURE AND METHOD OF FORMATION

This application is a divisional of Ser. No. 09/458,291 filed on Dec. 10, 1999 now U.S. Pat. No. 6,495,239.

BACKGROUND OF THE INVENTION

1. Technical Field

The present invention relates to a dielectric structure, and an associated method of fabrication, wherein two fully cured photoimageable dielectric (PID) layers of the structure are interfaced by a partially cured PID layer.

2. Related Art

Mechanical or laser drilling of holes in dielectric layers of a multilayer dielectric structure is expensive. Such drilling would potentially be eliminated if the dielectric layers were to include fully cured PID layers having photovias. However, a practical method of adhesively joining a pair of such fully cured PID layers is needed. Note that a PID layer is a layer that comprises PID material.

SUMMARY OF THE INVENTION

The present invention provides a method for forming a dielectric structure, comprising the steps of:

forming a first layer, wherein the first layer includes a first fully cured photoimageable dielectric (PID) material;

nonadhesively forming a sticker layer on the first layer, wherein the sticker layer includes a partially cured PID material; and nonadhesively forming a second layer on the sticker layer, wherein the second layer includes a second fully cured PID material.

The present invention provides a method for forming a dielectric structure, comprising the steps of:

forming a first layer, wherein the first layer includes a first fully cured photoimageable dielectric (PID) material;

nonadhesively forming a sticker layer on the first layer, wherein the sticker layer includes an internal power plane sandwiched between a first sheet of a partially cured PID material and a second sheet of the partially cured PID material; and nonadhesively forming a second layer on the sticker layer, wherein the second layer includes a second fully cured PID material.

The present invention provides a dielectric structure, comprising:

a first layer having a first fully cured photoimageable dielectric (PID) material;

a second layer having a second fully cured PID material; and a sticker layer having a partially cured PID material, wherein the sticker layer is nonadhesively sandwiched between the first layer and the second layer.

The present invention has the advantage of replacing laser-drilled or mechanically-drilled vias with photovias, which potentially reduces the costs associated with forming vias in layers of a dielectric structure.

The present invention has the advantage of allowing formation of a via with a relatively high aspect ratio (i.e., ratio of via height to via diameter). For example, a sidewall of a typical photovia makes an angle of about 10 degrees with a via axis. In contrast, a sidewall of a typical laser-drilled via makes an angle of about 20 to 30 degrees with the via axis.

The present invention has the advantage that a PID layer (i.e., a layer comprising PID material) does not include glass fibers. Conventional, non-PID dielectric layers typically contains glass fibers. A dielectric layer that includes glass fibers is susceptible to having metallic material, such as copper, growing along a glass fiber so as to form a short between two conductors touched by the glass fiber.

The present invention has the advantage of being able to utilize continuous rolls of PID material for making partially cured PID layers, which is less expensive than using conventional pre-cut panels of dielectric material.

DETAILED DESCRIPTION OF THE INVENTION

Figure 1:
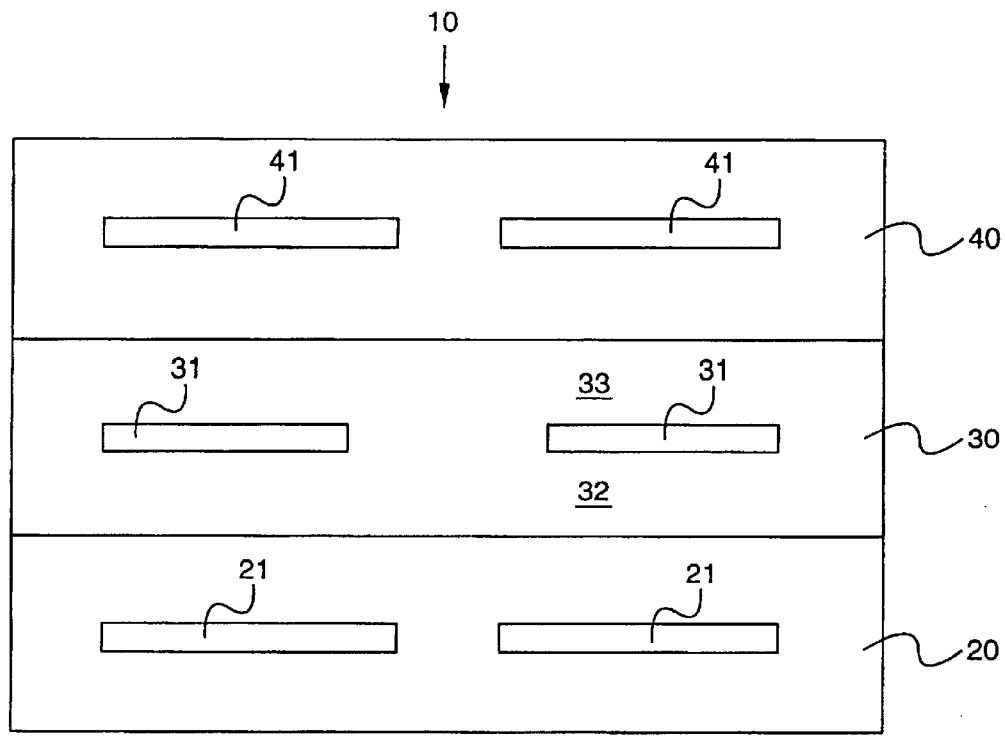
FIG. 1 depicts a front cross-sectional view of a dielectric structure having a sticker layer of partially cured photoimageable dielectric (PID) material sandwiched between two PID layers with each PID layer including fully cured PID material, in accordance with preferred embodiments of the present invention.

FIG. 1 depicts a front cross-sectional view of a dielectric structure 10 having a layer 30 nonadhesively sandwiched between layers 20 and 40, in accordance with preferred embodiments of the present invention. The layer 30 includes a partially cured photoimageable dielectric (PID) material, preferably with an internal power plane 31 having a hole 57, wherein the power plane 31 is sandwiched between a sheet 32 of the partially cured PID material and a sheet 33 of the partially cured PID material, wherein the hole 57 is filled with the partially cured PID material. The layer 20 preferably includes a first fully cured PID material with an internal power plane 21. The layer 40 preferably includes a second fully cured PID material with an internal power plane 41. Alternatively, either or both of the layer 20 and 40 may include a filled dielectric material containing a filler such as, inter alia, silica, alumina, dolomite, mica, and talc that is not susceptible to being cured upon subsequent pressurization or exposure to elevated temperature. A power plane is a layer of metal, such as copper, having one or more holes. Each of the preceding power planes 21, 31, and 41 are assumed to be present unless noted otherwise. The layer 30 is called a "sticker layer," because the layer 30, after being fully cured in a subsequent processing step, sticks to each of the layers 20 and 40 and therefore serves to join the layers 20 and 40 together. The layer 30 is an example a PID layer; i.e., a layer comprising PID material. Any PID material known to one skilled in the art may be used in the present invention, such as improved photoimageable cationically polymerizable epoxy based coating materials whose compositions are described in U.S. Pat. Nos. 5,026,624 (Day et al., Jun. 25, 1991) and 5,300,402 (Card, Jr. et al., Apr. 5, 1994).

PID material, if uncured, flows when subject to pressurization and/or elevated temperature. The propensity of PID material to flow diminishes as it undergoes a curing process. For this invention, a given specimen of PID material may exist in one of the following states of cure: uncured, partially cured, and fully cured. A specimen of PID material is "uncured" if the specimen has experienced no curing or negligible curing. A specimen of PID material is "partially cured" if the specimen has been cured to an extent that it will flow or deform, so as to nonadhesively couple with a contacting dielectric layer when subject to atmospheric pressure at ambient temperature, and adhesively bond with the contacting dielectric layer under subsequent pressurization and/or elevated temperature. A dielectric material that has been partially cured in the preceding manner is known to one skilled in the art as B-staged material, such as a B-staged organic resin. Partially cured PID material may include a filler material, such as silica, alumina, dolomite, mica, and talc, in combination with B-staged material. A specimen of PID material is "fully cured" if the specimen has been cured to such an extent that the PID material will not substantially flow, or substantially deform, if subject to subsequent pressurization and/or elevated temperature. The magnitude of pressurization and/or elevated temperature needed to effectuate adhesive bonding depends on, inter alia, such factors as: the degree of partial curing achieved prior to the pressurization and/or elevated temperature, the particular PID material that has been partially cured, and the roughness of the surface to which the partially cured PID material will be subsequently bonded. The elevated temperature(s) may be achieved in various ways such as with multiple heating cycles. Pressures in a range of about 100 psi to about 700 psi, coupled with elevated temperatures in a range of about 80° C. to about 250° C., are generally effective for full curing the B-staged materials. Pressures in a range of about 300 psi to about 00 psi at an elevated temperatures of about 190° C. for about one hour has been experimentally determined to be effective for B-staged material described in the Card, Jr. et al. patent cited supra.

For the present invention, full curing is accomplished by subjecting partially cured PID material to a combination of pressurization and temperature elevation. Also for the present invention, partial curing is accomplished by limited exposure of the PID material to radiation, such as ultraviolet radiation, and may be improved by accompanying and/or following the radiation exposure with heating such as at a temperature in a range of about 100° C. to about 150° C. for a period of time between about 3 minutes and about 15 minutes. With some materials, as are known to those skilled in the art, the partial curing may be accomplished by heating without radiation exposure. Partial curing by exposure of the PID material to radiation requires limitation of the radiative dose FT, where F is the energy flux (in such units as milliwatts/cm$^2$) of the radiation passing through the PID material and T is the total time of exposure to the radiation. If FT is too high, full curing rather than partial curing will occur. The range of FT that distinguishes partial curing from full curing depends on the specific PID material used inasmuch as each different PID material has its own characteristic chemical response to the incident radiation. One skilled in the art may determine practical ranges of FT for effectuating either full curing or partial curing, without undue experimentation, by varying FT through control of F and T for individually cured PID samples, followed by testing to determine whether the cured PID samples undergo liquification and flow upon subsequent pressurization and exposure to elevated temperatures.

An important characteristic of PID material is that PID material, if not exposed to a radiation that it is sensitive to such as ultraviolet radiation, may be chemically developed away by any method known to one of ordinary skill in the art. The specific method and the chemicals that may be used for developing away the PID material, including wet chemicals and dry chemicals, depends on the chemical composition of the PID material. In contrast, radiation exposure of PID material causes chemical cross-linking reactions in the PID material, which renders the PID material resistant to being chemically washed away by a developer solution. Thus, photovias may be formed in a layer of PID material by, inter alia, photolithographic masking schemes that prevent the radiation from reaching those volumes of the layer in which photovias are to be formed, but which allow radiation to interact with the other volumetric portions of the layer which may be subsequently exposed to the developer solution.

Figure 2:
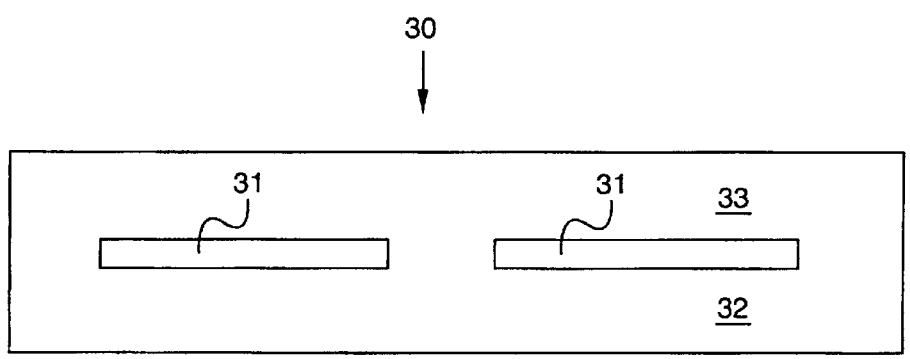
FIG. 2 depicts the sticker layer of FIG. 1 in isolation.
Figure 3:
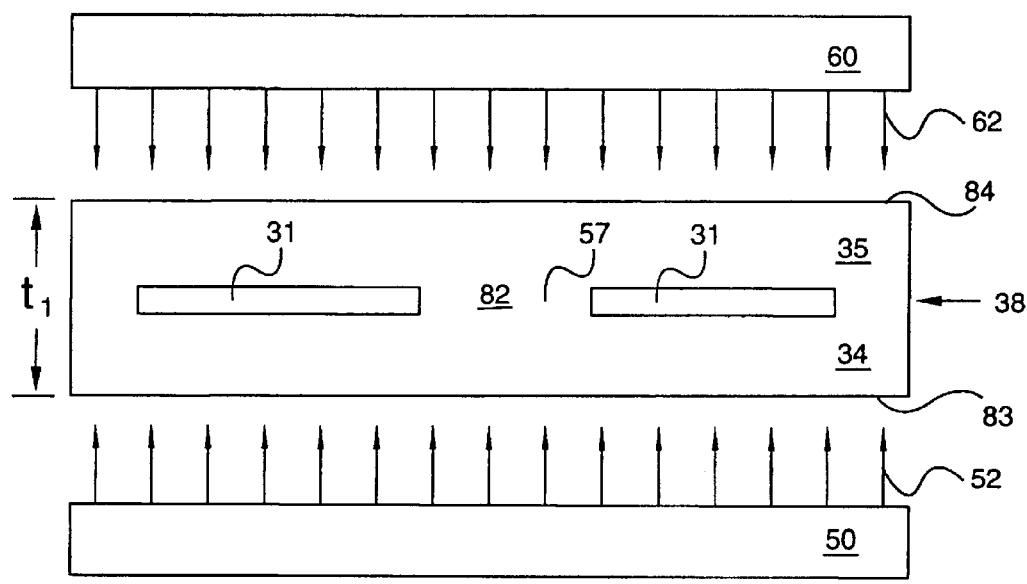
FIG. 3 depicts irradiation of an uncured PID layer to form the sticker layer of FIG. 2, in accordance with a first preferred embodiment of the present invention.

FIG. 2 illustrates the layer 30 of FIG. 1 in isolation from the layers 20 and 40. FIG. 3 illustrates a first embodiment of the present invention in which the layer 30 of FIG. 2 is formed in isolation from the layers 20 and 40 of FIG. 1. In FIG. 3, a sheet 38 of uncured PID material includes the power plane 31 (see FIG. 2) sandwiched between a sheet 34 of the uncured PID material and a sheet 35 of the uncured PID material. If the power plane 31 were absent, the sheet 35 would be positioned directly on the sheet 34. The radiation source 50 directs radiation 52, such as ultraviolet radiation, through the sheet 34 at an intensity and for a duration that causes the sheet 34 to become partially cured. Similarly, the radiation source 60 directs radiation 52, such as ultraviolet radiation, through the sheet 35 at an intensity and for a duration that causes the sheet 35 to become partially cured. The power plane 31 is opaque to the radiation 52 and thus prevents the radiation 52 from interacting with portions of the sheet 35. Similarly, power plane 31 is opaque to the radiation 62 and thus prevents the radiation 62 from interacting with portions of the sheet 34. Note that a region 82 encompasses a thickness $t_1$ of the sheet 38 such that the region 82 includes the hole 57 within the power plane 31. Thus, the region 82 of uncured PID material is potentially accessible to both the radiation 52 and the radiation 62. To ensure that the region 82 receives a dose of radiation that partially, and not fully, cures the region 82, the surface 83 and/or the surface 84 of the sheet 38 may be masked such that: only the radiation 52 passes through the region 82, only the radiation 62 passes through the region 82, or the intensity of the radiation 52 and the radiation 62 are adjusted to cause the PID material in the region 82 to be partially cured. In that manner, the PID material throughout the sheet 38 becomes partially cured. The radiation 52 and the radiation 62 may be directed to the sheet 38 either concurrently or during non-overlapping time periods. As a result of the preceding process, the sheet 38 of uncured PID material of FIG. 3 is transformed into the layer 30 of partially cured PID material shown in FIG. 2. If the power plane 31 is absent, the radiation 52 alone, the radiation 62 alone, or radiation 52 and the radiation 62 in combination may be used to form the layer 30 of partially cured PID material.

Figure 4:
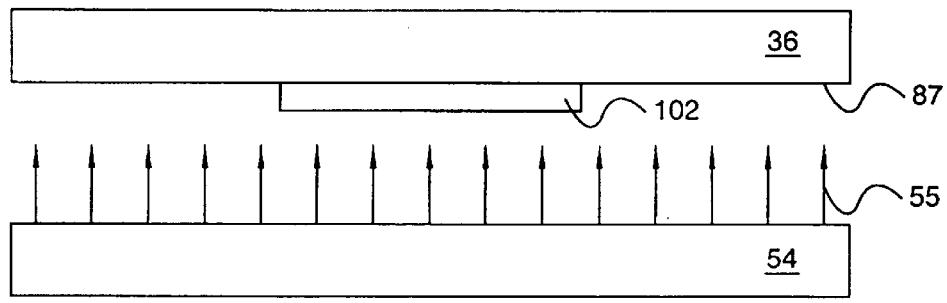
FIG. 4 depicts irradiation of a first sheet of uncured PID material for forming a sheet of partially cured PID material, in accordance with a second preferred embodiment of the present invention.

FIGS. 4–7 illustrate a second embodiment of the present invention such that the layer 30 of FIG. 2 is formed in isolation. FIG. 4 depicts a sheet 36 of uncured PID material and a radiation source 54. The radiation source 54 directs radiation 55, such as ultraviolet radiation, through the sheet 36 at an intensity and for a duration that causes the sheet 36 to become partially cured. As a result, the sheet 36 is radiatively transformed into the sheet 32 (see FIG. 2) of partially cured PID material. Note that a mask 102 covers a portion of a surface 87 of the sheet 36, which prevents a portion of the sheet 36 from being penetrated by the radiation 55 as will be discussed infra in conjunction with FIG. 6.

Figure 5:
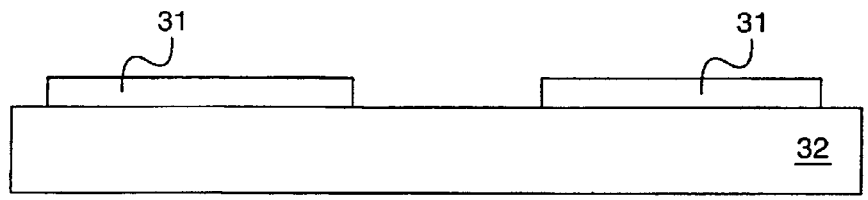
FIG. 5 depicts a power plane on the sheet of partially cured PID material formed in accordance with FIG. 4.

FIG. 5 illustrates the sheet 32 of partially cured PID material, formed as described infra in the discussion of FIG. 4; after the power plane 31 has been formed on the sheet 32 and before the sheet 33 (see FIG. 2) of partially cured PID material has been formed on the power plane 31.

Figure 6:
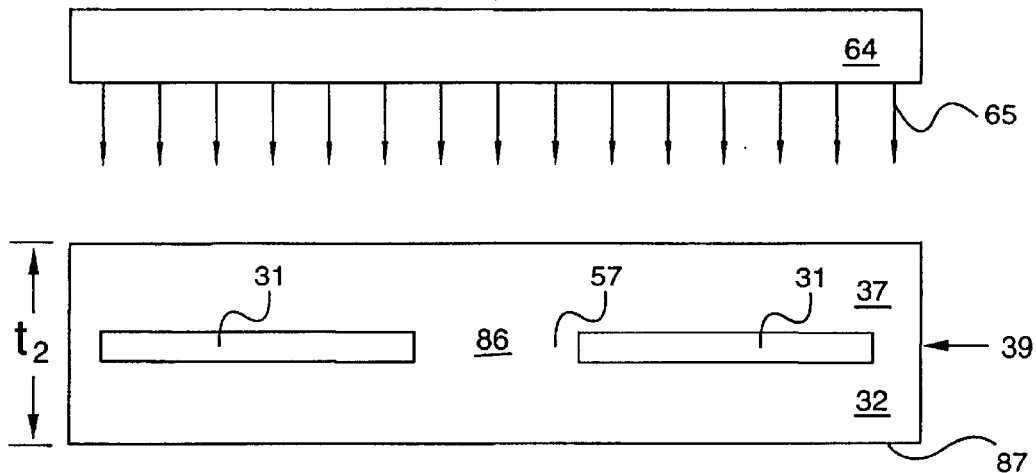
FIG. 6 depicts irradiating a second sheet of uncured PID material that has been layered on the power plane of FIG. 5.

FIG. 6 illustrates a sheet 39 of PID material that includes the power plane 31 on the sheet 32 of partially cured PID material of FIG. 5, and a sheet 37 of uncured PID material on the power plane 31. If the power plane 31 were absent, the sheet 37 would be positioned directly on the sheet 32. FIG. 6 also illustrates a radiation source 64 that directs radiation 65, such as ultraviolet radiation, through the sheet 37 at an intensity and for a duration that causes the sheet 37 to become partially cured. As a result, the sheet 37 is radiatively transformed into the sheet 33 (see FIG. 2) of partially cured PID material. The power plane 31 is opaque to the radiation 65 and thus prevents the radiation 65 from interacting with portions of the sheet 32. Note that a region 86 encompasses a thickness $t_2$ of the sheet 39 such that the region 86 includes the hole 57 within the power plane 31. Thus, a portion of the sheet 32 of partially cured PID material that is within the region 86 is potentially accessible to the radiation 65. To ensure that all of the region 86 receives a dose of radiation that partially, and not fully, cures the region 86, the surface 87 of the sheet 36 of FIG. 4 may have a mask 102 that prevents the radiation 55 from penetrating a portion of the sheet 36 that corresponds to the region 86 in FIG. 6. As a result, the region 86 of FIG. 6 is partially cured by the radiation 65. Accordingly, the PID material throughout the sheet 39 of FIG. 6 becomes partially cured. Thus, the sheet 39 of FIG. 6, which contains both uncured and partially cured PID material prior to receiving the radiation 65, is transformed by the radiation 65 into the layer 30 of partially cured PID material shown in FIG. 2.

Figure 7:
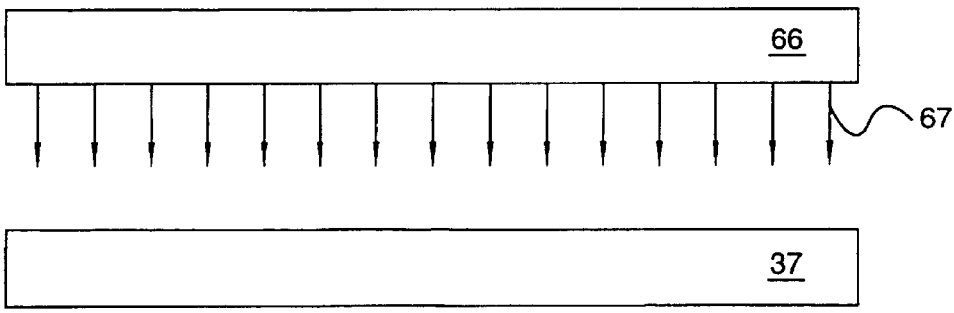
FIG. 7 depicts irradiating a second sheet of uncured PID material that will be subsequently layered on the power plane of FIG. 5.

A variation of the process of FIG. 6 is that the sheet 37 may be irradiated in isolation prior to being formed on the power plane 31. This variation is illustrated in FIG. 7 in which a radiation source 66 directs radiation 67, such as ultraviolet radiation, through the sheet 37 in isolation at an intensity and for a duration that causes the sheet 37 to become partially cured. As a result, the sheet 37 is radiatively transformed into the sheet 33 (see FIG. 2) of partially cured PID material. The sheet 33 thus formed in isolation from the power plane 31 of FIG. 5 or 6 is then layered on the power plane 31 of FIG. 5 to form the layer 30 of partially cured PID material shown in FIG. 2.

Figure 8:
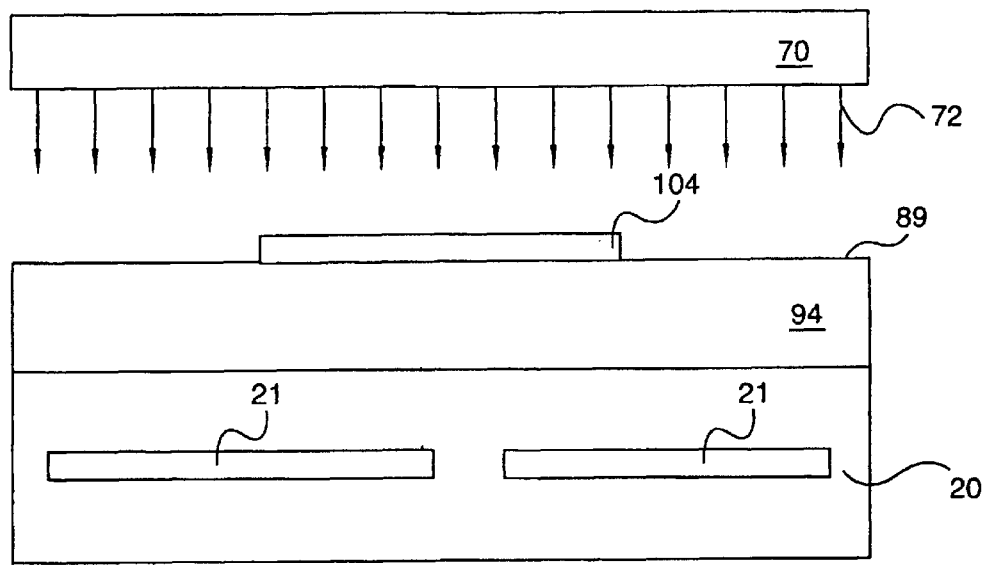
FIG. 8 depicts irradiating a first sheet of uncured PID material that has been layered on one of the PID layers of fully cured PID material of FIG. 1, in accordance with a third preferred embodiment of the present invention.

FIG. 8 illustrates irradiating a sheet 94 of uncured PID material that has been formed on the layer 20 of fully cured PID material of FIG. 1, in accordance with a third preferred embodiment of the present invention. The sheet 94 may be formed on the fully cured PID layer 20 by any method known to one of ordinary skill in the art such as by, inter alia, first running the sheet 94 through a hot lamination roll at a low temperature (e.g., at about 80° C.), or by using a vacuum lamination process. In FIG. 8, a radiation source 70 directs radiation 72, such as ultraviolet radiation, through the sheet 94 at an intensity and for a duration that causes the sheet 94 to become partially cured. As a result, the sheet 94 is radiatively transformed into the layer 32 of partially cured PID material of FIG. 1. Note that a mask 104 covers a portion of a surface 89 of the sheet 94, which prevents a portion of the sheet 94 from being penetrated by the radiation 72 as will be discussed infra in conjunction with FIG. 9. As an alternative to radiative curing, the sheet 94 may comprise non-photosensitive material and may be partially cured by application of heat.

Figure 9:
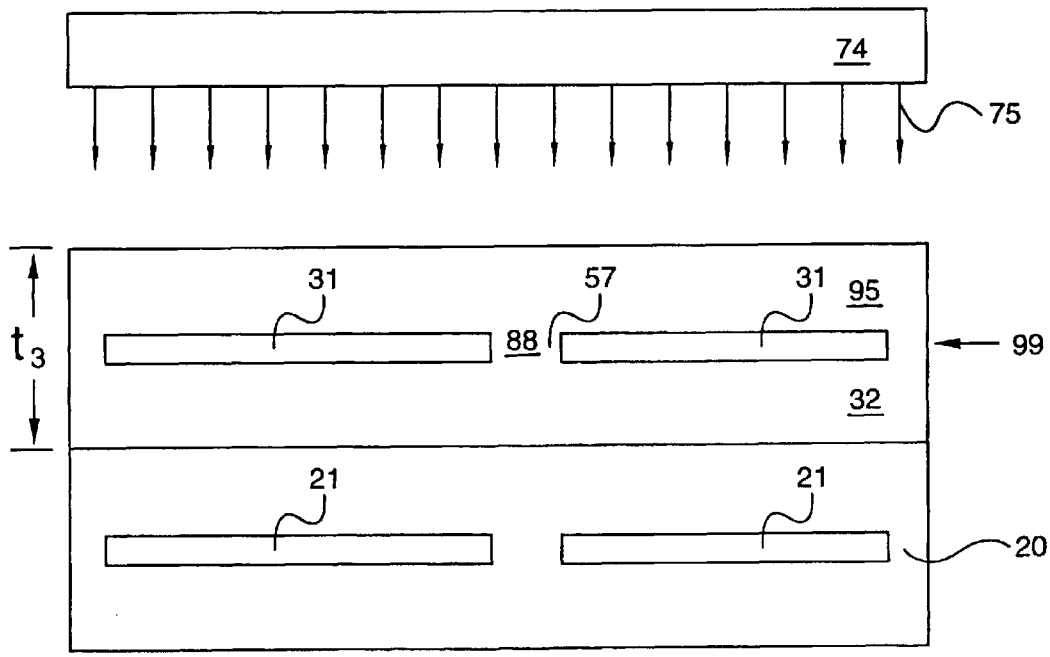
FIG. 9 depicts FIG. 8 after a power plane and a second sheet of uncured PID material have been successively layered on the first sheet of uncured PID material.

Next, FIG. 9 illustrates FIG. 8 after formation of the power plane 31 on the layer 32 that had been formed in accordance with FIG. 8, and formation of a sheet 95 of uncured PID material on the power plane 31. Thus, FIG. 9 includes a sheet 99 on the fully cured PID layer 20, wherein the sheet 99 comprises the layer 32 of partially cured PID material, the power plane 31 on the layer 32, and the sheet 95 of uncured PID material on the power plane 31. If the power plane 31 were absent, the sheet 95 would be positioned directly on the layer 32. A radiation source 74 directs radiation 75, such as ultraviolet radiation, through the sheet 95 at an intensity and for a duration that causes the sheet 95 to become partially cured. As a result, the sheet 95 is radiatively transformed into the layer 33 of partially cured PID material of FIG. 1. The power plane 31 is opaque to the radiation 75 and thus prevents the radiation 75 from interacting with portions of the layer 32. Note that a region 88 encompasses a thickness $t_3$ of the sheet 99 such that the region 88 includes the hole 57 within the power plane 31. Thus, a portion of the sheet 32 of partially cured PID material that is within the region 88 is potentially accessible to the radiation 75. To ensure that all of the region 88 receives a dose of radiation that partially, and not fully, cures the region 88, the surface 89 of the sheet 94 of FIG. 8 may have the mask 104 that prevents the radiation 72 from penetrating a portion of the sheet 94 that corresponds to the region 88 in FIG. 9. In that manner, the PID material throughout the region 88 of FIG. 9 becomes partially cured by the radiation 75. As a result of the preceding process, the sheet 99 of FIG. 9, which contains both uncured and partially cured PID material prior to being irradiated with the radiation 75, is transformed into the layer 30 of partially cured PID material shown in FIG. 2.

Figure 10:
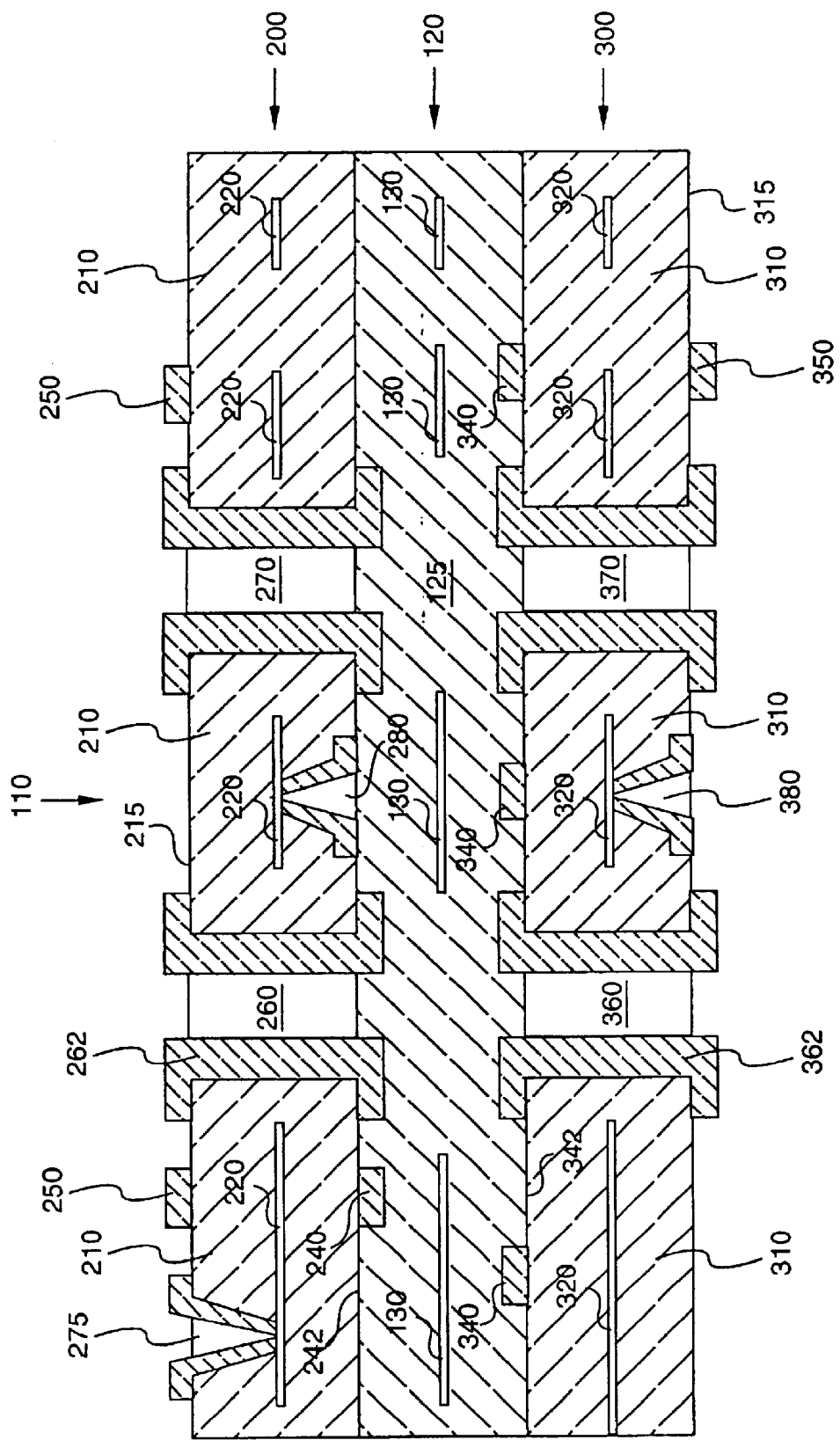
FIG. 10 depicts a front cross-sectional view of a dielectric structure having a sticker layer sandwiched between two 2S/1P layers with vias, in accordance with a fourth preferred embodiment of the present invention.

FIG. 10 illustrates a front cross-sectional view of a dielectric structure 110, comprising a sticker layer 120 nonadhesively sandwiched between a 2S/1P layer 200 and a 2S/1P layer 300, in accordance with a fourth preferred embodiment of the present invention. The sticker layer 120 includes a partially cured PID material 125 and an internal power plane 130. A 2S/1P layer generally comprises a dielectric layer with an internal power plane, a signal layer on a bounding surface of the dielectric layer, and another signal layer on another bounding surface of the dielectric layer. A signal plane is a layer of conductive circuit lines.

The 2S/1P layer 200 includes a first fully cured PID material 210, a power plane 220, and photovias 260, 270, 275, and 280. A signal plane 240 is on a first surface 242 of the 2S/1P layer 200 and a signal plane 250 is on a second surface 215 of the 2S/1P layer 200. The photovias 260, 270, 275, and 280 may be formed in the PID material of the 2S/1P layer 200 by methods described infra. The photovias 260, 270, 275, and 280 may each be plated with conductive material, such as a conductive plating 262 that plates the via 260. The photovias 260 and 270 each pass though a total thickness of the 2S/1P layer 200 and, if plated with conductive material, may electrically couple the signal plane 240 to the signal plane 250. If plated with conductive material, the photovia 280 may electrically couple the signal plane 240 to the power plane 220. If plated with conductive material, the photovia 275 may electrically couple the signal plane 250 to the power plane 220. As an alternative to the first fully cured PID material 210, the 2S/1P layer 200 may include a filled dielectric material containing a filler such as, inter alia, silica, alumina, dolomite, mica, and talc that is not susceptible to being cured upon subsequent pressurization or exposure to elevated temperature.

The 2S/1P layer 300 includes a second fully cured PID material 310, a power plane 320, and photovias 360, 370, and 380. A signal plane 340 is on a first surface 342 of the 2S/1P layer 300 and a signal plane 350 is on a second surface 315 of the 2S/1P layer 300. The photovias 360, 370, and 380 may be formed in the PID material of the 2S/1P layer 300 by methods described infra. The photovias 360, 370, and 380 may each be plated or filled with conductive material, such as a conductive plating 362 that plates the via 360. The photovias 360 and 370 each pass though a total thickness of the 2S/1P layer 300 and, if plated with conductive material, may electrically couple the signal plane 340 to the signal plane 350. If plated with conductive material, the photovia 380 may electrically couple the signal plane 350 to the power plane 320. As an alternative to the second fully cured PID material 310, the 2S/1P layer 300 may include a filled dielectric material containing a filler such as, inter alia, silica, alumina, dolomite, mica, and talc that is not susceptible to being cured upon subsequent pressurization or exposure to elevated temperature.

The dielectric structure 110 of FIG. 10 is analogous to the dielectric structure 10 of FIG. 1, wherein the sticker layer 120 of FIG. 10 is analogous to the sticker layer 30 of FIG. 1 with both having partially cured PID material, wherein the 2S/1P layer 200 of FIG. 10 is analogous to the layer 40 of FIG. 1 with both having fully cured PID material, and wherein the 2S/1P layer 300 of FIG. 10 is analogous to the layer 20 of FIG. 1 with both having fully cured PID material. Thus, the dielectric structure 110 of FIG. 10 may be formed by any of the methods discussed infra in conjunction with FIGS. 1–9. Note that the dielectric structure 110 of FIG. 10 shows structure not depicted for the dielectric structure 10 of FIG. 1, namely the aforementioned signal planes and vias of FIG. 10.

Figure 11:
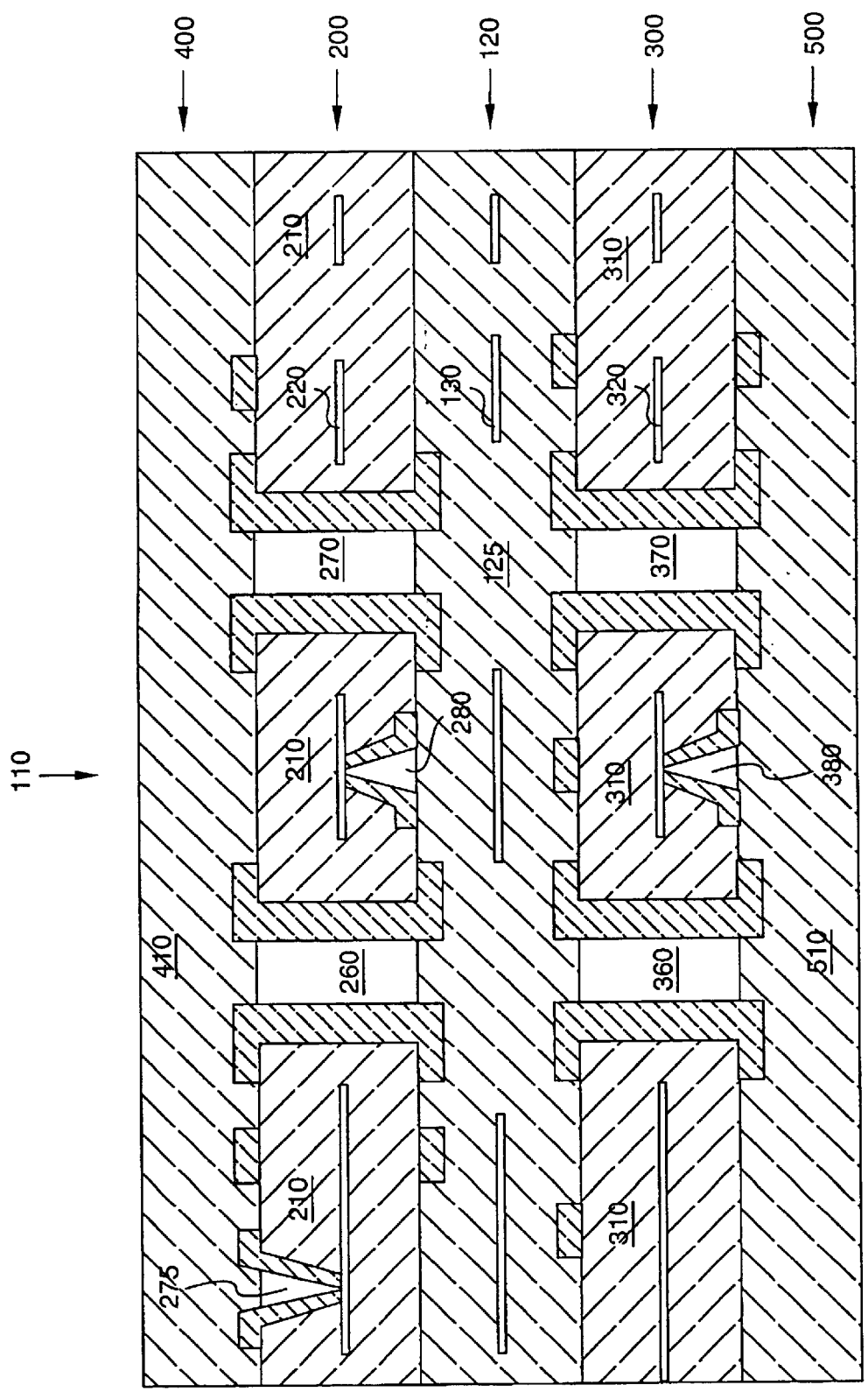
FIG. 11 depicts FIG. 10 after addition of films of partially cured PID material have been formed on the 2S/1P layers.

FIG. 11 illustrates FIG. 10 after a film 400 of partially cured PID material 410 has been nonadhesively formed on the 2S/1P layer 200 and after a film 500 of partially cured PID material 510 has been nonadhesively formed on the 2S/1P layer 300. The dielectric structure 110 in FIG. 11 comprises a nonadhesively layered stack sequentially comprising the film 500, the 2S/1P layer 300, the sticker layer 120, the 2S/1P layer 200, and the film 400.

Figure 12:
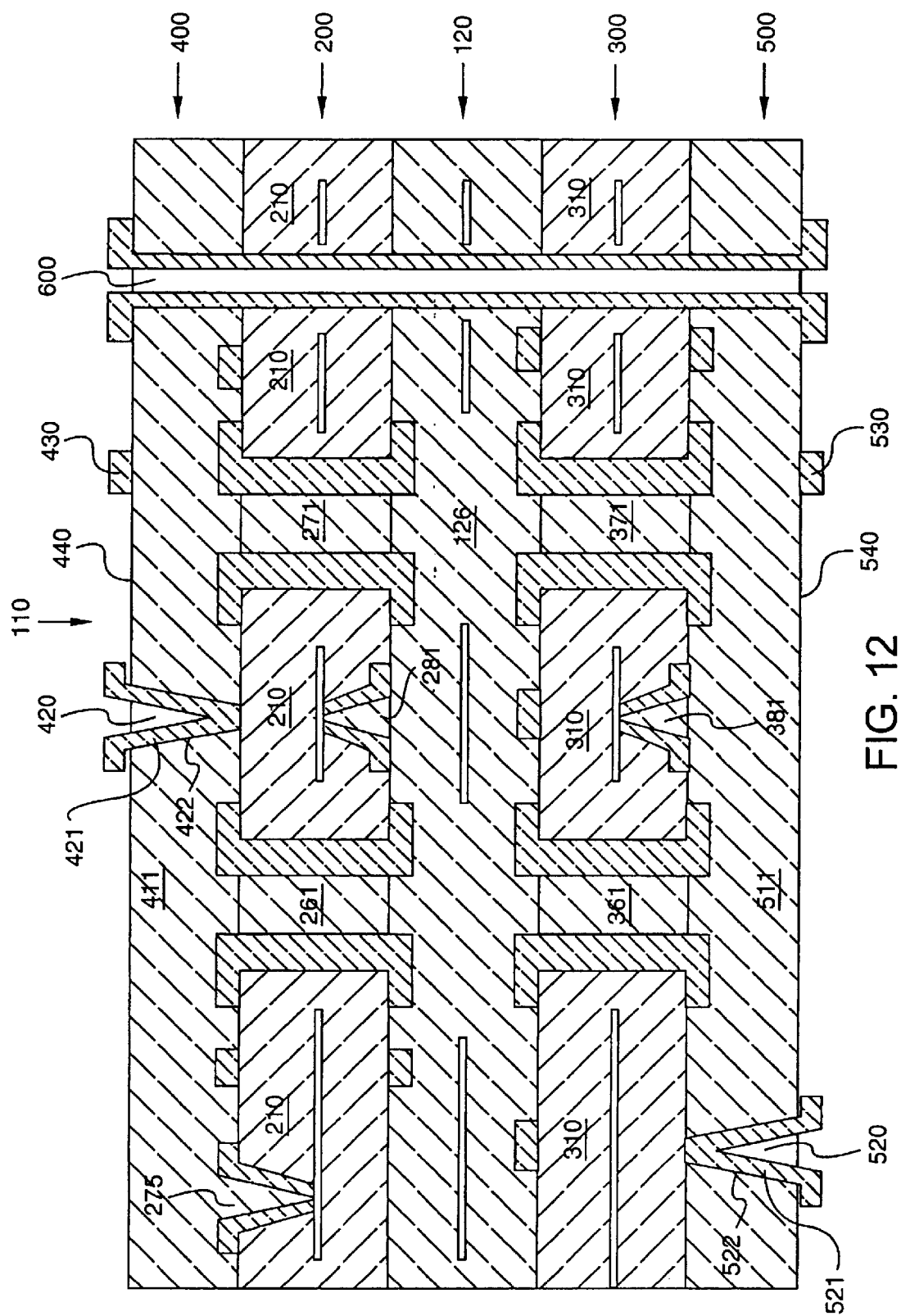
FIG. 12 depicts FIG. 11 after final cure of the dielectric structure.

FIG. 12 depicts FIG. 11 after a final lamination step that fully cures the partially cured PID materials 125, 410, and 510 of the dielectric structure 110, wherein the final lamination adhesively couples the aforementioned layers and films of the layered stack of the film 500, the 2S/1P layer 300, the sticker layer 120, the 2S/1P layer 200, and film 400. The final lamination is accomplished by pressurization and/or elevated temperature, which causes the adhesive coupling by having the partially cured PID material flowing into crevices of rough surfaces of interfacing layers. The pressurization could be accomplished by any method known to one skilled in the art, such as by compressing the dielectric structure 110 with a lamination press. In FIG. 11, the partially cured PID material 125 of the sticker layer 120, under pressurization and/or elevated temperature, flows into crevices of rough surfaces in the interfacing 2S/1P layers 200 and 300. In that manner, the sticker layer 120 provides adhesive interfacial coupling between the 2S/1P layers 200 and 300. Similarly, the partially cured PID material 410 of the film 400, under pressurization and/or elevated temperature, flows into crevices of rough surfaces in the interfacing 2S/1P layer 200. In that manner, the film 400 becomes adhesively bonded to the 2S/1P layer 200. Likewise, the partially cured PID material 510 of the film 500, under pressurization and/or elevated temperature, flows into crevices of rough surfaces in the interfacing 2S/1P layer 300. In that manner, the film 500 becomes adhesively bonded to the 2S/1P layer 300. The pressurization and/or elevated temperature also fully cures the partially cured PID materials. Thus, the partially cured PID material 125 of FIG. 11 becomes a fully cured PID material 126 as shown in FIG. 12. Similarly, the partially cured PID material 410 of FIG. 11 becomes a fully cured PID material 411 as shown in FIG. 12. Likewise, the partially cured PID material 510 of FIG. 11 becomes a fully cured PID material 511 as shown in FIG. 12.

By causing partially cured PID material to flow, the pressurization and/or elevated temperature compels the flowing partially cured PID material to fill the vias of the dielectric structure 110. The vias 260 and 270 of FIG. 11 are each filled with the partially cured PID material 125 and/or the partially cured PID material 410 to respectively form the filled vias 261 and 271 shown in FIG. 12. A filled via is a via that has been filled (i.e., plugged) with matter and is technically no longer a via. The vias 360 and 370 of FIG. 11 are each filled with the partially cured PID material 125 and/or the partially cured PID material 510 to respectively form the filled vias 361 and 371 shown in FIG. 12. The via 280 of FIG. 11 is filled with the partially cured PID material 125 to form the filled via 281 shown in FIG. 12. The via 275 of FIG. 11 is filled with the partially cured PID material 410 to form the filled via 276 as shown in FIG. 12. The via 380 of FIG. 11 is filled with the partially cured PID material 510 to form the filled via 381 shown in FIG. 12. The filled vias enhance the structural integrity of the dielectric structure 110 by eliminating internal voids.

Following the pressurization and/or elevated temperature in conjunction with FIG. 12, a via 420 may be formed in the film 400, and a via 520 may be formed in the film 500. Conductive material may be inserted into the via 420 by forming a conductive plating 421 on a wall 422 of the via 420. Alternatively, conductive material may be inserted into the via 420 by filling the via 420 with a conductive paste that includes the conductive material. Conductive material may be inserted into the via 520 by forming a conductive plating 521 on a wall 522 of the via 520. Alternatively, conductive material may be inserted into the via 520 by filling the via 520 with a conductive paste that includes the conductive material. Additionally, the dielectric structure 110 may be circuitized such as by adding a circuit line 430 to an exposed surface 440 of the dielectric structure 110, or as by adding a circuit line 530 to an exposed surface 540 of the dielectric structure 110. Further, a plated through hole (PTH), such as the PTH 600, may be drilled or otherwise formed through the dielectric structure 110 to facilitate electrical coupling among the film 500, the 2S/1P layer 300, the sticker layer 120, the 2S/1P layer 200, and film 400.

Although FIG. 12 depicts a five-layer structure, the present invention could include any number (N) of layers (e.g., 17 or more layers), such that the N-layered structure minimally includes a sticker layer sandwiched between two fully cured PID layers. Accordingly, the pressurization and/or temperature elevation step, as described infra in conjunction with the five-layer structure of FIG. 12, also could be implemented in conjunction with the three-layer structures of FIG. 1 and FIG. 10 as well with any structure within the present invention that has any number of layers.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A method for forming a dielectric structure, comprising the steps of:

forming a first layer, wherein the first layer includes a first fully cured photoimageable dielectric (PID) material;

nonadhesively forming a sticker layer on the first layer, wherein the sticker layer includes a partially cured PID material; and nonadhesively forming a second layer on the sticker layer, wherein the second layer includes a second fully cured PID material, wherein the sticker layer is nonadhesively sandwiched between the first layer and the second layer such that the sticker layer is in non-adhesive contact with the first layer and in non-adhesive contact with the second layer, and wherein the sticker layer is capable of remaining in non-adhesive contact with the first layer and the second layer until the sticker layer is subsequently subjected to additional curing.

2. The method of claim 1, further comprising fully curing the partially cured PID material, wherein said fully curing adhesively couples the first layer to the sticker layer, and wherein said fully curing adhesively couples the second layer to the sticker layer.

3. The method of claim 2, wherein the step of forming a sticker layer includes exposing a layer of uncured PID material to radiation to form the partially cured PID material, and wherein fully curing the partially cured PID material includes selecting from the group consisting of pressurizing the dielectric structure, exposing the dielectric structure to an elevated temperature, and combinations thereof.

4. A method for forming a dielectric structure, comprising the steps of:

forming a first layer, wherein the first layer includes a first fully cured photoimageable dielectric (PID) material;

nonadhesively forming a sticker layer on the first layer, wherein the sticker layer includes an internal power plane sandwiched between a first sheet of a partially cured PID material and a second sheet of the partially cured PID material; and nonadhesively forming a second layer on the sticker layer, wherein the second layer includes a second fully cured PID material, wherein the sticker layer is nonadhesively sandwiched between the first layer and the second layer such that the sticker layer is in non-adhesive contact with the first layer and in non-adhesive contact with the second layer, and wherein the sticker layer is capable of remaining in non-adhesive contact with the first layer and the second layer until the sticker layer is subsequently subjected to additional curing.

5. The method of claim 4, wherein the partially cured PID material is selected from the group consisting of a B-staged organic resin and a B-staged organic resin combined with a filler material.

6. The method of claim 4, wherein the step of forming a sticker layer on the first layer includes:

forming the sticker layer in isolation from both the first layer and the second-layer; and layering the sticker layer on the first layer.

7. The method of claim 6, wherein forming the sticker layer in isolation includes:

forming the first sheet of the partially cured PID material;

forming the power plane on the first sheet of the partially cured PID material; and forming the second sheet of the partially cured PID material on the power plane.

8. The method of claim 6, wherein forming the sticker layer in isolation includes:

forming a first sheet of an uncured PID material;

partially curing the first sheet of the uncured PID material, wherein the first sheet of the partially cured PID material is formed;

forming the power plane on the first sheet of the partially cured PID material;

forming a second sheet of the uncured PID material;

partially curing the second sheet of the uncured PID material, wherein the second sheet of the partially cured PID material is formed; and selecting from the group consisting of layering the second sheet of the uncured PID material on the power plane prior to partially curing the second sheet of the uncured PID material and layering the second sheet of the partially cured PID material on the power plane.

9. The method of claim 8, wherein partially curing the first sheet of the uncured PID material includes passing radiation through the first sheet of the uncured PID material, and wherein partially curing the second sheet of the uncured PID material includes passing radiation through the second sheet of the uncured PID material.

10. The method of claim 6, wherein the step of forming the sticker layer in isolation includes:

forming a first sheet of an uncured PID material;

forming the power plane on the first sheet of the uncured PID material;

forming a second sheet of the uncured PID material on the power plane; and partially curing the first sheet of the uncured PID material and partially curing the second sheet of the uncured PID material, wherein the sticker layer is formed.

11. The method of claim 10, wherein partially curing the first sheet of the uncured PID material includes passing radiation through the first sheet of the uncured PID material, and wherein partially curing the second sheet of the uncured PID material includes passing radiation through the second sheet of the uncured PID material.

12. The method of claim 4, wherein the step of forming a sticker layer on the first layer includes:
   forming the first sheet of the partially cured PID material on the first layer;
   forming the power plane on the first sheet of the partially cured PID material; and
   forming the second sheet of the partially cured PID material on the power plane.

13. The method of claim 12,
   wherein forming the first sheet of the partially cured PID material on the first layer includes forming a first sheet of an uncured PID material on the first layer and partially curing the first sheet of the uncured PID material, and
   wherein forming the second sheet of the partially cured PID material on the power plane includes forming a second sheet of the uncured PID material on the power plane and partially curing the second sheet of the uncured PID material.

14. The method of claim 13, wherein partially curing the first sheet of the uncured PID material includes passing radiation through the first sheet of the uncured PID material, and wherein partially curing the second sheet of the uncured PID material includes passing radiation through the second sheet of the uncured PID material.

15. The method of claim 4,
   wherein the first layer is a first 2S/1P layer that includes a first internal power plane, a first signal plane on a first surface of the first 2S/1P layer, and a second signal plane on a second surface of the first 2S/1P layer, and
   wherein the second layer is a second 2S/1P layer that includes a second internal power plane, a third signal plane on a first surface of the second 2S/1P layer, and a fourth signal plane on a second surface of the second 2S/1P layer.

16. The method of claim 15, further comprising:
   forming a first via in the first 2S/1P layer, wherein the first via electrically couples the first signal plane to the first internal power plane;
   forming a second via through the first 2S/1P layer, wherein the second via electrically couples the first signal plane to the second signal plane;
   forming a third via in the second 2S/1P layer, wherein the third via electrically couples the third signal plane to the second internal power plane; and
   forming a fourth via through the second 2S/1P layer, wherein the fourth via electrically couples the third signal plane to the fourth signal plane.

17. The method of claim 16, further comprising:
   nonadhesively forming a first film on the first 2S/1P layer, wherein the first film includes a first partially cured PID material; and
   nonadhesively forming a second film on the second 2S/1P layer, wherein the second film includes a second partially cured PID material.

18. The method of claim 17,
   wherein the step of nonadhesively forming a first film includes exposing a sheet of a first uncured PID material to radiation; and
   wherein the step of nonadhesively forming a second film includes exposing a sheet of a second uncured PID material to radiation.

19. The method of claim 18, further comprising fully curing the partially cured PID material, fully curing the first partially cured PID material, and fully curing the second partially cured PID material, resulting in:
   the sticker layer adhesively coupled to the first layer;
   the sticker layer adhesively coupled to the second layer;
   the first film adhesively coupled to the first layer,
   the second film adhesively coupled to the second layer,
   the first via plugged;
   the second via plugged;
   the third via plugged; and
   the fourth via plugged.

20. The method of claim 19, wherein fully curing the partially cured PID material, fully curing the first partially cured PID material, and fully curing the second partially cured PID material are collectively accomplished by stressing the dielectric structure, wherein the stressing is selected from the group consisting of pressurizing, exposing to an elevated temperature, and combinations thereof.

21. The method of claim 19, further comprising:
   forming a fifth via through a total thickness of the first film,
   inserting a first conductive material into the fifth via by a process selected from the group consisting of plating the fifth via with the first conductive material and filling the fifth via with a conductive paste that includes the first conductive material;
   forming a sixth via through a total thickness of the second film; and
   inserting a second conductive material into the sixth via by a process selected from the group consisting of plating the sixth via with the second conductive material and filling the sixth via with a conductive paste that includes the second conductive material.

22. The method of claim 19, further comprising:
   forming a first circuit line on an exposed surface of the dielectric structure;
   forming a second circuit line on an exposed surface of the dielectric structure; and
   forming a plated through hole through a total thickness of the dielectric structure.

* * * * *